(12) United States Patent
Rachmady et al.

(10) Patent No.: US 7,670,894 B2
(45) Date of Patent: Mar. 2, 2010

(54) SELECTIVE HIGH-K DIELECTRIC FILM DEPOSITION FOR SEMICONDUCTOR DEVICE

(75) Inventors: Willy Rachmady, Beaverton, OR (US); Marko Radosavljevic, Beaverton, OR (US); Mantu K. Hudait, Portland, OR (US); Matthew V Metz, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/150,898

(22) Filed: Apr. 30, 2008

(65) Prior Publication Data

US 2009/0272965 A1 Nov. 5, 2009

(51) Int. Cl.
*H01L 21/8238* (2006.01)
*H01L 21/44* (2006.01)
(52) U.S. Cl. .................................. 438/216; 438/613
(58) Field of Classification Search ............... 428/613, 428/761, 694, 780; 257/E21.26; 438/613, 438/761, 694, 780, 216
See application file for complete search history.

(56) References Cited

U.S. PATENT DOCUMENTS

| | | | | |
|---|---|---|---|---|
| 6,309,953 B1* | 10/2001 | Fischer et al. | ............... | 438/606 |
| 7,223,700 B2* | 5/2007 | Wong et al. | ................. | 438/706 |
| 2005/0233597 A1* | 10/2005 | Colburn et al. | .............. | 438/780 |
| 2006/0071275 A1* | 4/2006 | Brask et al. | .................. | 257/350 |
| 2006/0121678 A1* | 6/2006 | Brask et al. | .................. | 438/287 |
| 2006/0210993 A1* | 9/2006 | Chowdhury et al. | ........... | 435/6 |
| 2007/0040235 A1* | 2/2007 | Chan et al. | ................... | 257/510 |
| 2007/0224348 A1* | 9/2007 | Dickey et al. | ............ | 427/248.1 |
| 2008/0056945 A1* | 3/2008 | Hattori | ...................... | 422/68.1 |
| 2008/0087890 A1* | 4/2008 | Ahn et al. | ..................... | 257/43 |

OTHER PUBLICATIONS

S. Datta, "85nm Gate Length Enhancement and Depletion Mode InSb Quantum Well Transistors for Ultra High Speed and Very Low Power Digital Logic Applications", Components Research, Technology and Manufacturing Group, Intel Corporation, Hillsboro, USA, 4 pages.

* cited by examiner

*Primary Examiner*—Thomas L Dickey
*Assistant Examiner*—Nikolay Yushin
(74) *Attorney, Agent, or Firm*—Blakely, Sokoloff, Taylor & Zafman LLP

(57) ABSTRACT

Embodiments of the present invention describe a method of fabricating a III-V quantum well transistor with low current leakage and high on-to-off current ratio. A hydrophobic mask having an opening is formed on a semiconductor film. The opening exposes a portion on the semiconductor film where a dielectric layer is desired to be formed. A hydrophilic surface is formed on the exposed portion of the semiconductor film. A dielectric layer is then formed on the hydrophilic surface by using an atomic layer deposition process. A metal layer is deposited on the dielectric layer.

22 Claims, 12 Drawing Sheets

SELECTIVE HIGH-K DIELECTRIC FILM DEPOSITION FOR SEMICONDUCTOR DEVICE

BACKGROUND OF THE INVENTION

1. Field of the Invention

The present invention relates to the field of semiconductor processing and more particularly to the selective formation of dielectric layer for a semiconductor device.

2. Discussion of Related Art

One of the common techniques of forming a dielectric layer on a semiconductor device is deposition followed by etching. The dielectric layer is first blanket deposited onto a semiconductor film. Next, a photo-resist film is deposited on the dielectric layer. The photo-resist film is then masked, exposed and developed into a desired pattern that exposes certain portions of the dielectric layer for patterning. Etching is then performed to remove portions of the dielectric layer not covered by the patterned photo-resist film, thus forming a patterned dielectric layer. However, etching may cause damage to the underlying semiconductor film, which affects the performance of the semiconductor device.

Furthermore, in trying to improve the performance of semiconductor devices, new materials have been proposed for use. One example is the substitution of silicon materials used in transistors with III-V compound semiconductor materials that consist of elements from columns III and V of the periodic table. Examples of III-V compound semiconductors are indium antimonide (InSb) and gallium arsenide (GaAs).

Replacing silicon in the transistor channel with III-V compound semiconductor materials results in much higher electron mobility in the transistor channel, which leads to higher performance and less energy consumption. One type of transistor that utilizes III-V compound semiconductor materials is the III-V quantum well transistor. III-V quantum well transistors have shown to be suitable for high speed and low power logic applications. In comparison with metal oxide semiconductor field effect transistors (MOSFETS), quantum well transistors have shown to provide faster switching speed while reducing power consumption.

An example of a conventional III-V quantum well transistor is illustrated in FIG. 1. III-V quantum well transistor 100 includes a semi-insulating gallium arsenide (GaAs) substrate 110, a semiconductor epitaxial structure 120, a Schottky metal gate 160 and ohmic contacts 161, 162. The semiconductor epitaxial structure 120 consists of an aluminum indium antimony (AlInSb) buffer layer 122, a channel layer 124 and an AlInSb barrier layer 126. Channel layer 124 can be made of indium antimony (InSb) and is formed between barrier layer 126 and buffer layer 122. The Schottky metal gate 160 is formed on a recess 146 etched on the top of the AlInSb barrier layer 126. Ohmic contacts 161, 162 can be source and drain contacts.

As illustrated in FIG. 1, III-V quantum well transistors currently rely on Schottky barrier height as the junction barrier between the channel and gate. As a result, the on-to-off current ratio for these III-V quantum well transistors does not meet high-speed requirements for advance logic applications. Furthermore, the quiescent-state leakage currents present in Schottky metal gates affect the integration of III-V quantum well transistors into large-scale integrated circuits.

Hence, there is need for an improved method of fabricating a semiconductor device that overcomes the limitations of Schottky metal gates as well as minimizing damages associated with etching.

DETAILED DESCRIPTION OF THE PRESENT INVENTION

A method of selectively forming a dielectric layer of a semiconductor device is described. In the following description, numerous specific details are set forth in order to provide a thorough understanding of the present invention. In other instances, well known semiconductor processing techniques and features have not been described in particular detail in order to not unnecessarily obscure the present invention.

In particular, embodiments of the present invention describe a method of selectively forming a high-k gate dielectric of a transistor so as to provide low current leakage and high on-to-off current ratio. In an embodiment of the present invention, a hydrophobic mask having an opening is formed on a semiconductor film, wherein the opening of the hydrophobic mask exposes a portion on the semiconductor film where a gate dielectric is desired to be formed. Then, the hydrophobic mask and the semiconductor film are exposed to a treatment that forms a hydrophilic surface on the exposed portion of the semiconductor film but not on the hydrophobic mask. Next, a high-k gate dielectric is formed on the hydrophilic surface of the semiconductor film but not on the hydrophobic mask. High-k gate dielectric is formed by using an area selective approach, such as an atomic layer deposition (ALD) technique, which eliminates the need of using etching to pattern the gate dielectric and thus, prevents the semiconductor film and any underlying substrate from damage associated with etching. A gate electrode is then formed on the gate dielectric. The depositions of both the gate dielectric and the gate electrode are self-aligned because both depositions are directed by the same hydrophobic mask.

In a specific embodiment, the hydrophobic mask and the semiconductor film are exposed to a treatment that forms a trench with hydrophilic surfaces on the exposed portion of the semiconductor film but not on the hydrophobic mask. Gate dielectric is then formed on the trench using ALD, followed by forming the gate electrode on the gate dielectric. Although the method of the present invention is described for selectively forming a gate dielectric of a transistor, it is understood that the method of the present invention may be used to form other types of dielectrics such as tunnel dielectrics or capacitor dielectrics so as to fabricate other types of semiconductor devices, such as but not limited to non-volatile memory devices and capacitors.

Figure 1:
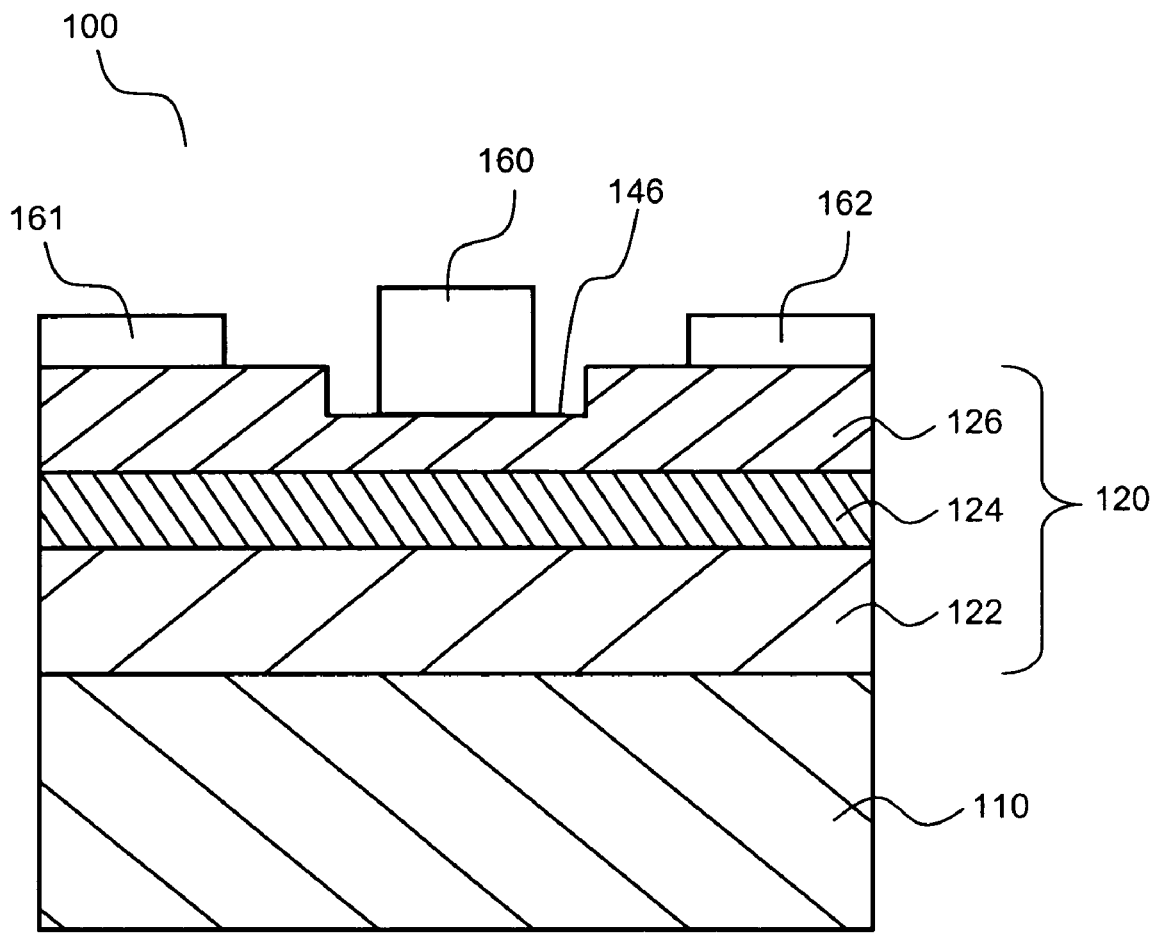
FIG. 1 is an illustration of a conventional III-V quantum well transistor.
Figure 2:
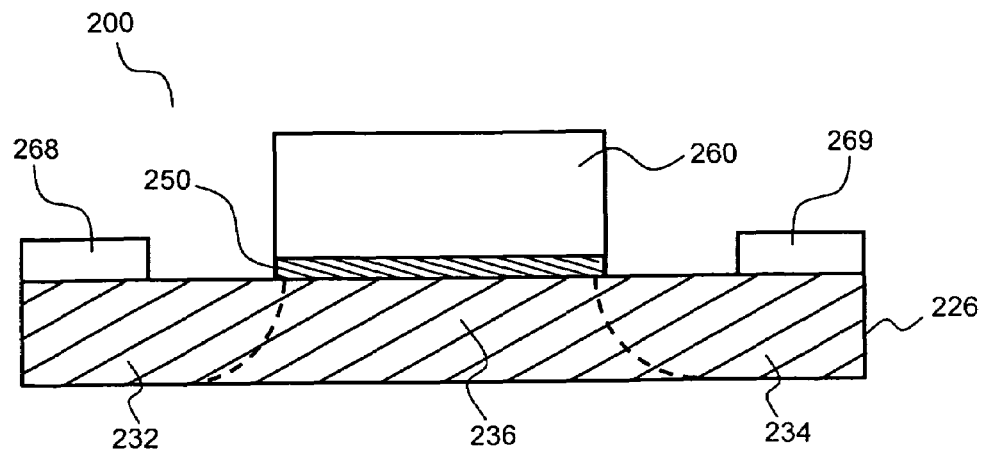
FIG. 2 is an illustration of a transistor in accordance with one embodiment of the present invention.

FIG. 2 illustrates a transistor 200 fabricated in accordance with one embodiment of the present invention. The transistor 200 comprises a semiconductor layer 226 having a gate dielectric 250 formed thereon. A gate electrode 260 is formed on the gate dielectric 250. Metal contacts 268, 269 are formed on the semiconductor layer 226 on either sides of the gate electrode 260. In one embodiment, the semiconductor layer 226 is a semiconductor film, such as a silicon film of a silicon on insulator (SOI) substrate or a semiconductor substrate such as a monocrystalline silicon. In another embodiment, the semiconductor layer 226 is made of a III-V compound semiconductor material such as but not limited to AlP-based, AlAs-based, AlSb-based, GaP-based, GaAs-based, GaSb-based, GaAl-based, InP-based, InAs-based, InSb-based, InAl-based or InGa-based semiconductor material.

In one embodiment, gate dielectric 250 is any insulative material used for insulating semiconductor layer 226 from gate electrode 260. In one embodiment, the gate dielectric 250 is made from a dielectric film with a high dielectric constant, ideally greater than 8.0 (i.e. k>8.0). In one embodiment, the gate dielectric 250 is a metal oxide dielectric, such as but not limited to hafnium oxide ($HfO_2$), zirconium oxide ($ZrO_2$), lanthanum oxide ($La_2O_3$), niobium oxide ($NbO_2$), aluminum oxide ($Al_2O_3$), titanium oxide ($TiO_2$) or tantalum oxide ($TaO_2$). In another embodiment, the gate dielectric 250 is made of lead zirconate titanate (PZT) or barium strontium titanate (BST). Gate electrode 260 is made of metal or metal alloy materials, such as but not limited to tungsten, tantalum, titanium and their nitrides.

Source region 232 and drain region 234 are formed in the semiconductor layer 226 on either sides of the gate electrode 260. In one embodiment, transistor 200 is a conventional silicon inversion MOSFET device such as a NMOS or PMOS transistor, wherein source and drain regions 232, 234 are formed in the semiconductor layer 226 on opposite sides of the gate electrode 260 by, for example an ion-implantation process, and are of an opposite conductivity type to the region 236 of the semiconductor layer 226 below the gate dielectric 250 (i.e. the channel region). For example, in a NMOS transistor, source and drain regions 232, 234 are n-type and the region 236 is p-type channel region. In another embodiment, transistor 200 is a III-V transistor such as but not limited to a modulation doped field effect transistor (MODFET) or a quantum well transistor, wherein the source and drain regions 232, 234 consist of the same conductivity type and structure as the region 236 below the gate dielectric 250. In MOSFET devices, metal contacts 268, 269 are formed on the semiconductor layer 226 on either sides of the gate electrode 260 to provide contacts to the source and drain regions 232, 234. For example, metal contact 268 is made to contact source region 232, and metal contact 269 is made to contact drain region 234. In III-V transistors, metal contacts 268, 269 are made of a material that provide ohmic contact to the source and drain regions 232, 234.

Figure 3:
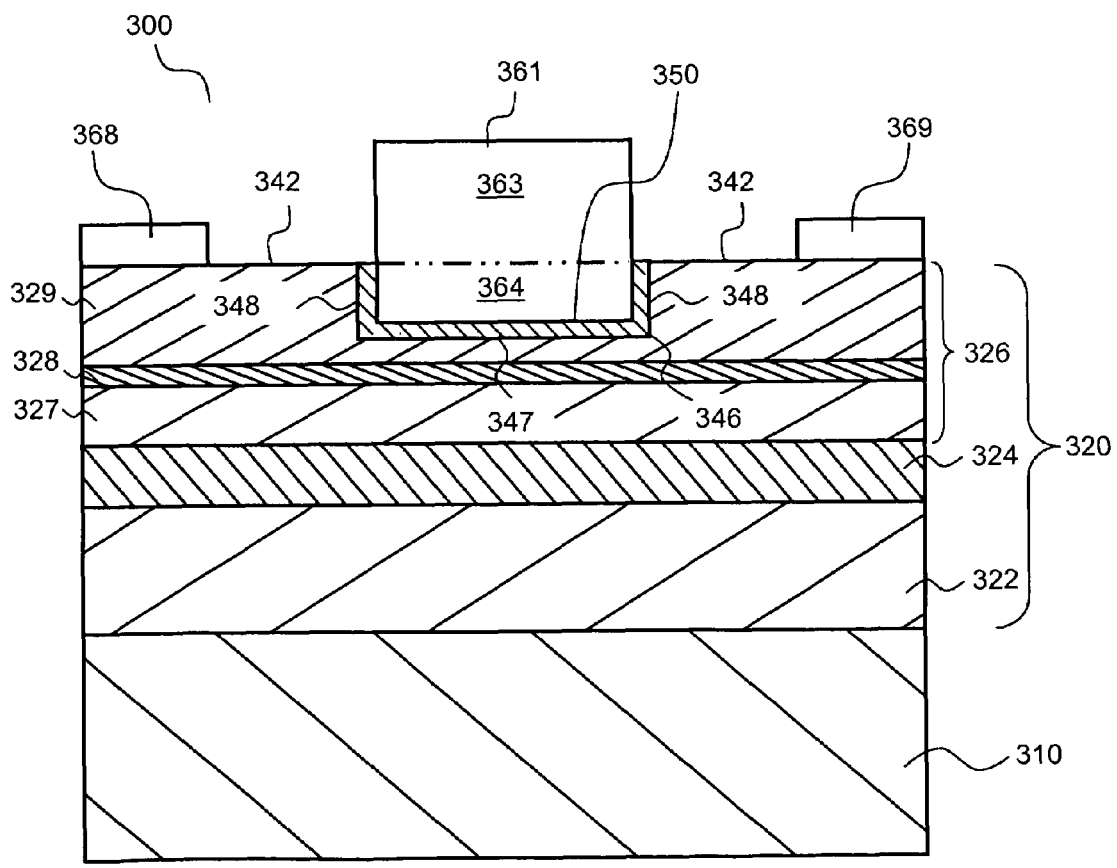
FIG. 3 is an illustration of a III-V quantum well transistor in accordance with one embodiment of the present invention.

FIG. 3 illustrates a III-V quantum well transistor 300 fabricated in accordance with one embodiment of the present invention. The III-V quantum well transistor 300 comprises a semiconductor epitaxial structure 320 formed on a substrate 310. In one embodiment, the substrate 310 is made from well known materials such as silicon (Si) or gallium arsenide (GaAs).

Semiconductor epitaxial structure 320 can consists of multiple layers. In one embodiment, the semiconductor epitaxial structure 320 comprises a buffer layer 322, a channel layer 324 and a barrier layer 326, wherein the channel layer 324 is formed between the buffer layer 322 and the barrier layer 326. In one embodiment, the buffer layer 322 has a thickness in the range of 90-110 nm, the channel layer 324 has a thickness in the range of 10-20 nm, and the barrier layer 326 has a thickness in the range of 30-50 nm. Buffer layer 322 is grown on the substrate 310, wherein the buffer layer 322 may comprise transitional layers to compensate for any lattice mismatch between the semiconductor epitaxial structure 320 and the substrate 310. In one embodiment, the channel layer 324 is made of a semiconductor material having a lower bandgap than both the buffer layer 322 and barrier layer 326. In one embodiment, the lower band gap material used for the channel layer 324 is a III-V compound semiconductor such as but not limited to InSb, and higher band gap material used for both the buffer layer 322 and barrier layer 326 is a III-V compound semiconductor such as but not limited to AlInSb. In another embodiment, the lower band gap material used for the channel layer 324 is a III-V compound semiconductor InGaAs, and higher band gap material used for both the buffer layer 322 and barrier layer 326 is a III-V compound semiconductor such as but not limited to InAlAs. The use of lower bandgap materials allows higher electron mobility in the channel layer 324 when the III-V quantum well transistor 300 is in operation. Furthermore, the channel layer 324 is formed between both the buffer layer 322 and barrier layer 326 that uses higher bandgap materials so as to reduce the effects of device leakage and breakdown.

In one embodiment, the barrier layer 326 comprises multiple semiconductor layers. In a specific embodiment, the barrier layer 326 comprises a spacer layer 327, a Si δ-doped layer 328 and a top barrier 329. Spacer layer 327 is formed on the channel layer 324. Si δ-doped layer 328 is formed between the spacer layer 327 and top barrier 329. Top barrier 329 comprises a top surface 342 having a recess or trench 346 formed thereon. The trench 346 includes a bottom surface 347 and sidewalls 348, wherein the sidewalls 348 extend from the bottom surface 347 of the trench 346 to the top surface 342 of the top barrier 329. The depth of the trench 346 relative to the channel layer 324 determines if the III-V quantum well transistor 300 operates as an enhancement mode or depletion mode device. Depth of the trench 346 refers to the distance from the top surface 342 of the top barrier 329 to the bottom surface 347 of the trench 346.

A gate dielectric 350 is deposited in the trench 346 and conforms to the sidewalls 348 and bottom surface 347 of the trench 346. In one embodiment, the gate dielectric 350 is made from a dielectric film with a high dielectric constant, ideally greater than 8.0 (i.e. k>8.0). In one embodiment, the gate dielectric 350 is a metal oxide dielectric, such as but not limited to hafnium oxide ($HfO_2$), zirconium oxide ($ZrO_2$), lanthanum oxide ($La_2O_3$), niobium oxide ($NbO_2$), aluminum oxide ($Al_2O_3$), titanium oxide ($TiO_2$) or tantalum oxide ($TaO_2$). In another embodiment, the gate dielectric 350 is made of lead zirconate titanate (PZT) or barium strontium titanate (BST).

A metal gate electrode 361 is formed on the gate dielectric 350. In particular, the metal gate electrode 361 includes a top portion 363 and a bottom portion 364, wherein the bottom portion 364 is formed on the gate dielectric 350 and is fully encapsulated by the gate dielectric 350. By encapsulating the bottom portion 364 of the metal gate electrode 361, a low gate leakage device can be achieved. The metal gate electrode 361 is made of metal or metal alloy materials, such as but not limited to tungsten, tantalum, titanium and their nitrides. Furthermore, the metal gate electrode 361 has a work function that can be selected to determine if the III-V quantum well transistor 300 operates as an enhancement mode or depletion mode device. One advantage of using the metal gate electrode 361 with the high-k gate dielectric 350 is the significant reduction in the gate leakage current as compared to a Schottky metal gate.

Source and drain regions (not shown) are formed in the barrier layer 326. The channel layer 324 couples the source region to the drain region and allows charge flow from the source to drain, depending on the operational state of the gate electrode 361. Furthermore, metal contacts 368, 369 are formed on the top surface 342 of top barrier 329, wherein the metal contacts 368, 369 are made to provide ohmic contacts to the source and drain regions.

Figure 4A:
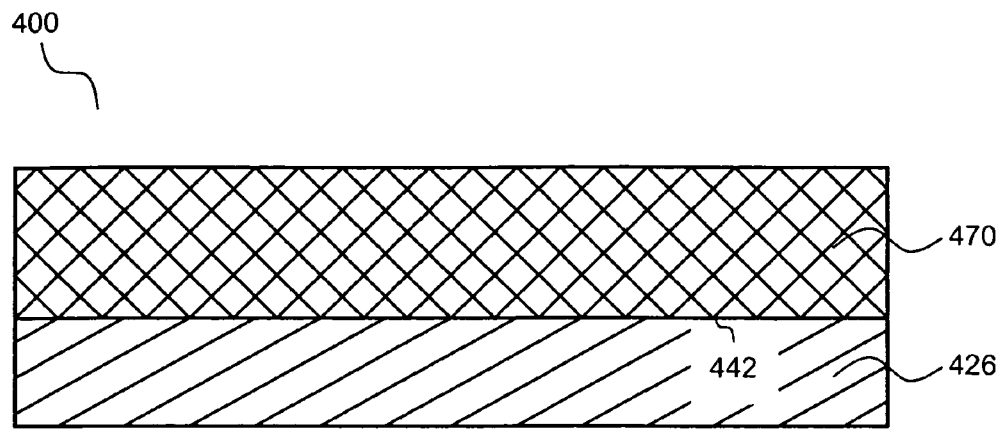
FIGS. 4A-4J illustrate a method of forming a semiconductor device in accordance with one embodiment of the present invention.

FIGS. 4A-4J illustrate a method of forming a semiconductor device 400. In particular, the method can be used to form the transistor 200 as shown in FIG. 2. The fabrication of the semiconductor device 400 begins by forming a hydrophobic mask having an opening on a semiconductor layer, wherein the opening exposes a portion on the semiconductor layer where a dielectric layer is desired to be formed. In one embodiment, the fabrication of the hydrophobic mask begins by blanket depositing a masking layer 470 on a top surface 442 of a semiconductor layer 426 as shown in FIG. 4A.

Figure 4B:
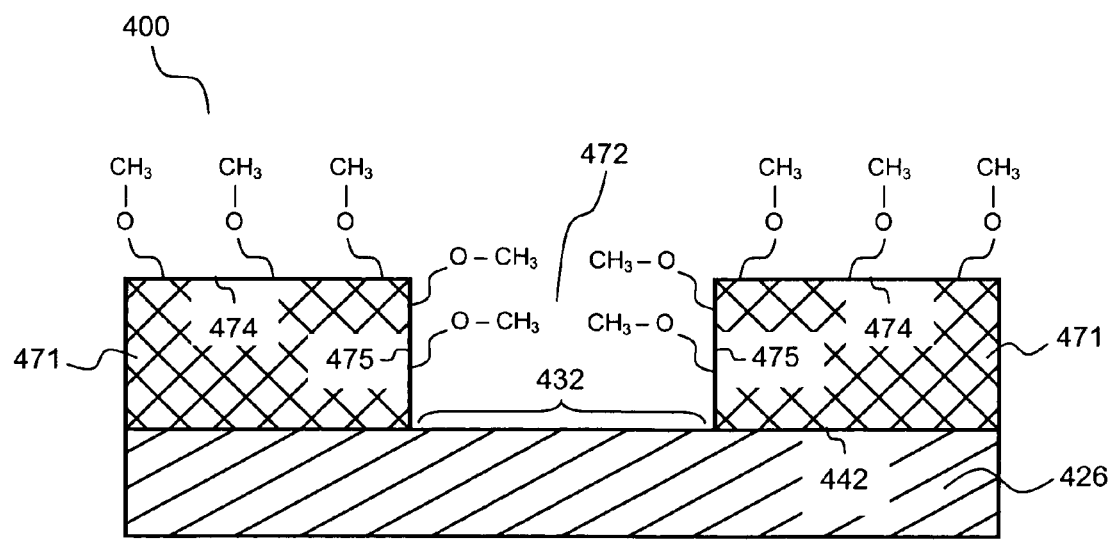

In one embodiment, the masking layer 470 is a photo-resist layer that is made of a highly hydrophobic and photo-definable material. Photo-resist layer is made from a highly hydrophobic material so as to prevent dielectric nucleation thereon during the subsequent process of forming the dielectric layer. In a specific embodiment, photo-resist layer is made of a material that comprises methoxy (—O—CH$_3$) functional groups, such as but not limited to poly-methyl-methacrylate (PMMA). The photo-resist layer is blanket deposited on the top surface 442 of the semiconductor layer 426 using conventional methods such as a spin coating technique. Then, the photo-resist layer is exposed to a radiation source such as an ultra-violet (UV) light or an electron beam (e-beam) and subsequently developed to form an opening 472 and create a patterned photo-resist layer 471 as shown in FIG. 4B. In one embodiment, the photo-resist layer is exposed to a UV light having a wavelength in the range of 100-300 nm, depending on the type of material the photo-resist layer is made of.

In an embodiment, the portions of photo-resist layer to be exposed to the radiation source will be removed upon developing the photo-resist layer, i.e. photo-resist layer is composed of a positive photo-resist material. In a specific embodiment, photo-resist layer is composed of positive photo-resist material selected from the group consisting of the PMMA as described earlier, a 248 nm resist, a 193 nm resist, a 157 nm resist and an extreme ultra-violet (EUV) resist.

In another embodiment, the portions of photo-resist layer to be exposed to the light source will be retained upon developing the photo-resist layer, i.e. photo-resist layer is composed of a negative photo-resist material. In a specific embodiment, photo-resist layer is composed of a negative photo-resist material selected from the group consisting of poly-cis-isoprene and poly-vinyl-cinnamate.

The patterned photo-resist layer 471 remains highly hydrophobic and is hereinafter referred to as a hydrophobic mask 471. In one embodiment, hydrophobic mask 471 is PMMA that comprises methoxy (—O—CH$_3$) functional groups. Referring to FIG. 4B, the top surfaces 474 and side surfaces 475 of the hydrophobic mask 471 are terminated with methoxy (—O—CH$_3$) functional groups that prevents dielectric nucleation thereon during the latter process of forming the dielectric layer. Opening 472 extends from top surface 474 of the patterned photo-resist layer 471 to the top surface 442 of the semiconductor layer 426. In particular, the opening 472 exposes a portion 432 (hereinafter referred to as exposed portion 432) on the top surface 442 of the semiconductor layer 426, wherein the exposed portion 432 is a region where a dielectric layer is desired to be formed.

In another embodiment, the masking layer 470 is a photo-resist layer made from a material that is not sufficiently hydrophobic to prevent dielectric nucleation thereon during the subsequent process of forming the dielectric layer. For example, the masking layer 470 is a phenolic resin matrix with a diazonaphthoquinone sensitizer. After patterning the phenolic resin with well-known photolithography process, the patterned phenolic resin is exposed to a chemical solution to increase its hydrophobicity, thus forming the hydrophobic mask 471. For example, the patterned phenolic resin can be exposed to a chemical solution, such as but not limited to organo alcohols, organo esters and organo ethers to increase its hydrophobicity.

In another embodiment, the masking layer 470 is made of a non-photodefinable material that is not sufficiently hydrophobic to prevent dielectric nucleation thereon during the subsequent process of forming the dielectric layer. For example, the masking layer 470 is an organo terminated layer such as but not limited to organo-siloxane, organic polymers and carbon-based oligimers. Masking layer 470 is patterned using well-known photolithography and etching techniques to form a patterned masking layer having opening 472. The patterned masking layer is then exposed to a chemical treatment to make its surfaces hydrophobic without making the exposed portion hydrophobic, thus forming the hydrophobic mask 471. In a specific embodiment, the chemical treatment uses a chemical solution selected from the group consisting of organo alcohols, organo esters and organo ethers.

Figure 4C:
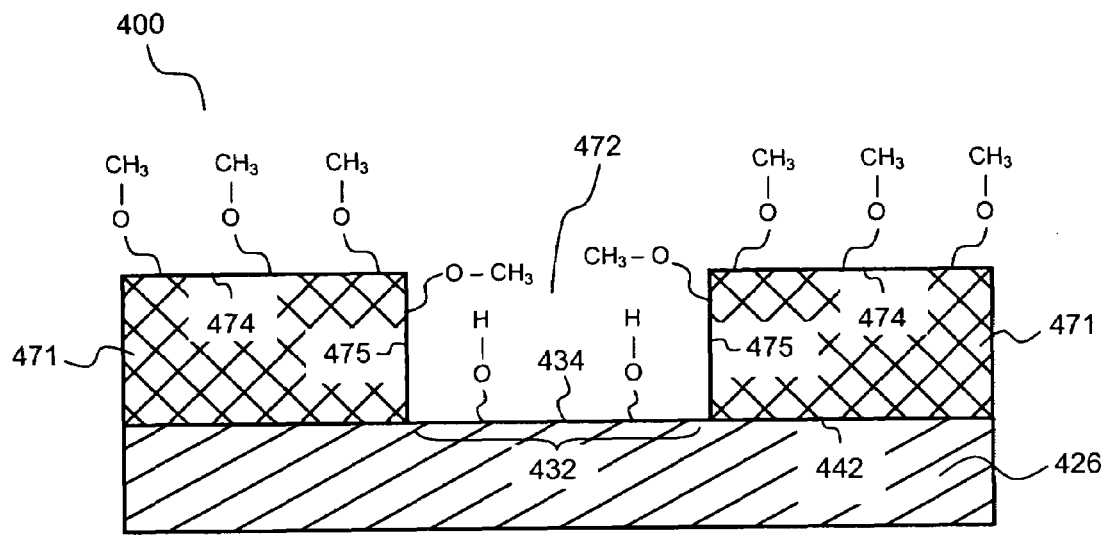

Next, a hydrophilic surface 434 is formed on the exposed portion 432 of the semiconductor layer 426 but not on the hydrophobic mask 471 as show in FIG. 4C. In one embodiment, the exposed portion 432 and the hydrophobic mask 471 are exposed to a chemical treatment that is reactive to the exposed portion 432 and unreactive to the hydrophobic mask 471. In an embodiment of the present invention, the chemical treatment employs an aqueous solution that is acid-based and comprises an acid, an oxidant, and a water diluent. For example, the acid used can be citric acid, lactic acid or nitric acid (HNO$_3$), and the oxidant can be hydrogen peroxide (H$_2$O$_2$). The aqueous solution chemically reacts with the exposed portion 432 to form the hydrophilic surface 434 thereon, wherein the hydrophilic surface 434 is terminated with hydroxyl (—O—H) functional groups as shown in FIG. 4C. On the other hand, the hydrophobic mask 471 consisting of methoxy (—O—CH$_3$) functional groups is unreactive to the aqueous solution and the top and side surfaces 474, 475 of the hydrophobic mask 471 remain terminated with methoxy (—O—CH$_3$) functional groups.

Next, a dielectric layer is selectively formed on the hydrophilic surface 434 and not on the hydrophobic mask 471. In one embodiment, dielectric layer is formed by an atomic layer deposition (ALD) technique. In an ALD process, the semiconductor device 400 is alternatingly exposed to a first precursor and a second precursor to form the dielectric layer on the hydrophilic surface 434 of exposed portion 432 but not on the hydrophobic mask 471. In one embodiment, to form a metal oxide dielectric, the first precursor is a metal-containing precursor and the second precursor is an oxygen-containing precursor. In a specific embodiment, the metal-containing precursor is a metal halide, such as but not limited to hafnium tetrachloride (HfCl$_4$), hafnium bromide (HfBr$_4$), hafnium iodide (HfI$_4$), zirconium tetrachloride (ZrCl$_4$) and lanthanum trichloride (LaCl$_3$), and the oxygen-containing precursor is water (H$_2$O).

Figure 4D:
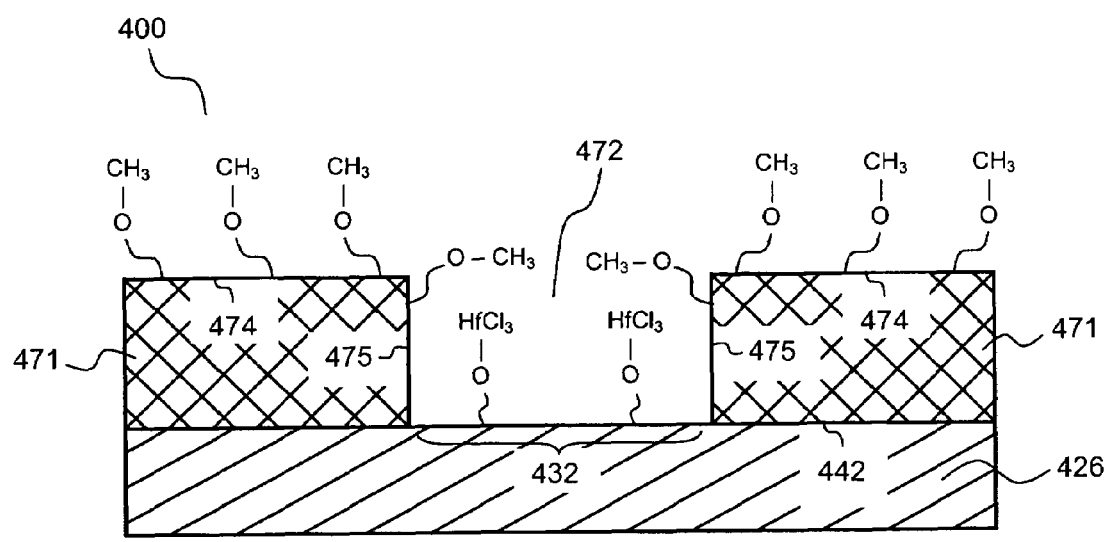
Figure 4E:
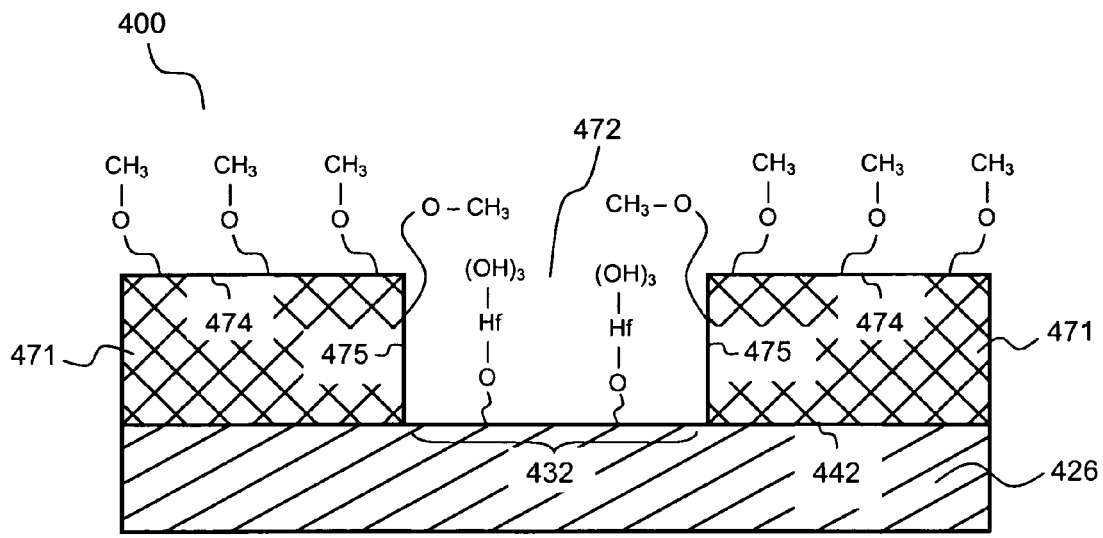

FIGS. 4D and 4E illustrate one ALD cycle of forming the dielectric layer. In FIG. 4D, the semiconductor device 400 is exposed to the first precursor. In one embodiment, the first precursor is a metal-containing precursor, for example HfCl$_4$, which reacts with the OH terminated hydrophilic surface 434 to form a metal-centered ligand (e.g. —O—HfCl$_3$). After exposing to the first precursor, the semiconductor device 400 is exposed to the second precursor in FIG. 4E. The second precursor is an oxygen-containing precursor, for example water (H$_2$O), which converts the metal-centered ligand (—O—HfCl$_3$) to a metal-hydroxyl ligand (e.g. O—Hf—(OH)$_3$). This completes one ALD cycle. The ALD cycle is then repeated until a desired thickness of the dielectric layer is formed. For example, 20-30 ALD cycles may be performed to form a metal oxide dielectric with a thickness of 10-20 angstroms.

Figure 4F:
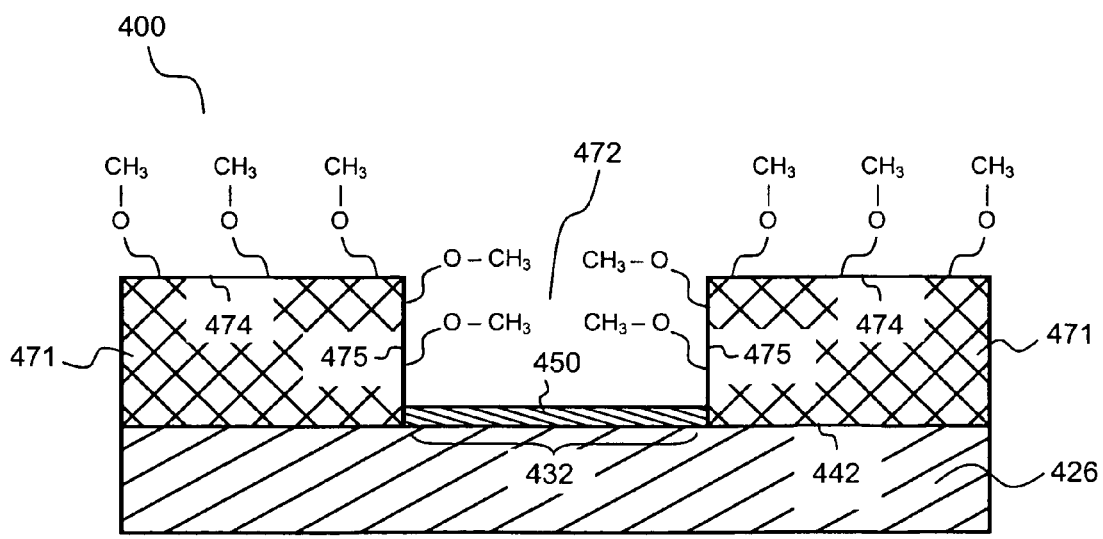

FIG. 4F illustrates the dielectric layer 450 as formed on the exposed portion 432 of the semiconductor layer 426 but not the hydrophobic mask 471. The hydrophobic mask 471 consisting of methoxy (—O—CH$_3$) functional groups is unreactive to both the first and second precursors, thus preventing the dielectric growth or nucleation on the hydrophobic mask 471. In the case where the first and second precursors use HfCl$_4$ and water (H$_2$O) respectively, the dielectric layer 450 formed is a hafnium oxide (HfO$_2$) dielectric, wherein the HfO$_2$ dielectric is a high-k dielectric. In another embodiment, the first and second precursors use ZrCl$_4$ and water (H$_2$O) respectively. Then, the dielectric layer 450 formed is a zirconium oxide (ZrO$_2$) dielectric, which is also a high-k dielectric. Hence, by manipulating the type of functional groups present on the hydrophobic mask 471 and the exposed portion 432 on the semiconductor layer 426, the growth of the dielectric layer 450 can be specifically directed onto the exposed portion 432. Furthermore, the deposition of the dielectric layer 450 on the semiconductor layer 426 is self-aligned to the opening 472 of the hydrophobic mask 471.

Figure 4G:
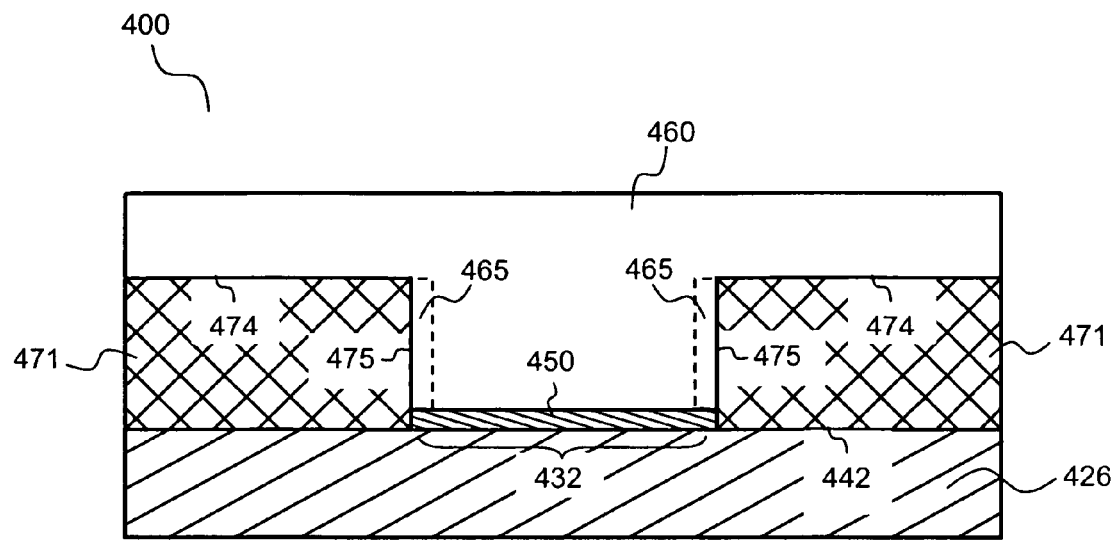

Next, a metal electrode is formed on top of the dielectric layer 450. In one embodiment, the fabrication of the metal electrode begins by depositing a metal layer 460 onto the dielectric layer 450 and the top and side surfaces 474, 475 of the hydrophobic mask 471, as shown in FIG. 4G. In one embodiment, the metal layer 460 is blanket deposited on the dielectric layer 450 and hydrophobic mask 471 by well known methods such as but not limited to chemical vapor deposition (CVD), physical vapor deposition (PVD) and evaporation. The metal layer 460 can be made of metal or metal alloy materials, such as but not limited to tungsten, tantalum, titanium and their nitrides.

Figure 4H:
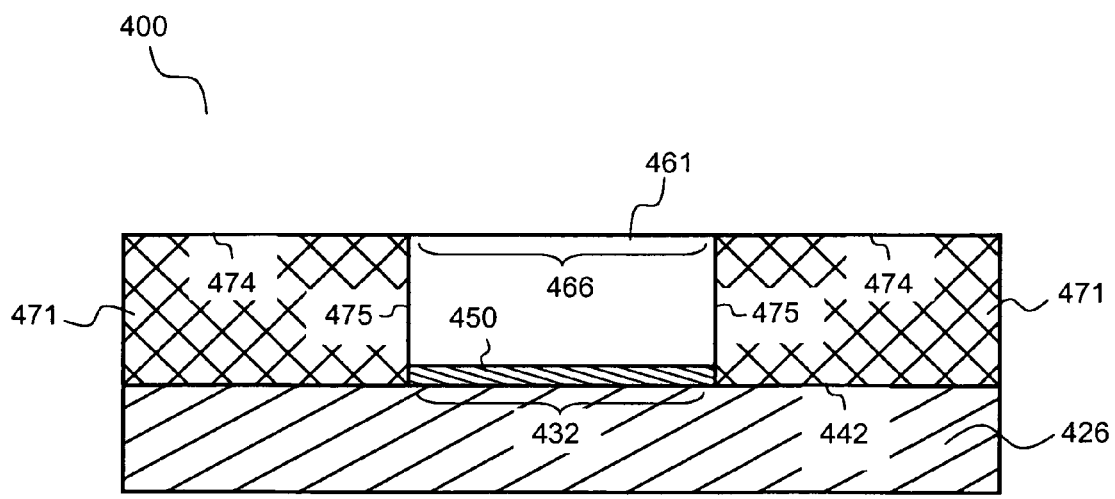

In one embodiment, the metal electrode is formed by planarizing the metal layer 460 and then removing the hydrophobic mask 471. Beginning from FIG. 4G, the metal layer 460 is planarized using well known techniques such as chemical mechanical polishing (CMP) or plasma etch back to form a metal electrode 461 as shown in FIG. 4H. The metal electrode 461 has a top surface 466 that is coplanar with the top surface 474 of the hydrophobic mask 471. Next, the hydrophobic mask 471 is removed from the semiconductor layer 426 using known methods such as ashing or etching, leaving the metal electrode 461 on the dielectric layer 450 as shown in FIG. 4I.

In another embodiment, the metal electrode 461 is formed by selectively deposition onto the dielectric layer 450. Beginning from FIG. 4F, the metal electrode 461 is deposited on the dielectric layer 450 as shown in FIG. 4H by using well known methods such as but not limited to electrolysis deposition. The hydrophobic mask 471 is then removed to reveal the metal electrode 461 deposited directly on the dielectric layer 450, thus forming the metal electrode 461 as shown in FIG. 4I.

In another embodiment, a lift-off process is used to form the metal electrode. In the lift-off process, a removal solvent is exposed to the semiconductor device 400 in FIG. 4G to loosen the hydrophobic mask 471 formed on the semiconductor layer 426. Next, the hydrophobic mask 471 is lifted off or removed from the semiconductor layer 426, and any portions of the metal layer 460 formed on the hydrophobic mask 471 are also removed during the lift off. In particular, the lift off of the hydrophobic mask 471 causes the portions 465 of the metal layer 460 deposited on the side surfaces 475 of the hydrophobic mask 471 to be removed together with the hydrophobic mask 471. The only metal layer 460 remaining after the lift off is the portion of the metal layer 460 deposited directly onto the gate dielectric 450, as shown in FIG. 4J, which results in the formation of a modified metal electrode 462. This completes the lift-off process.

Figure 4I:
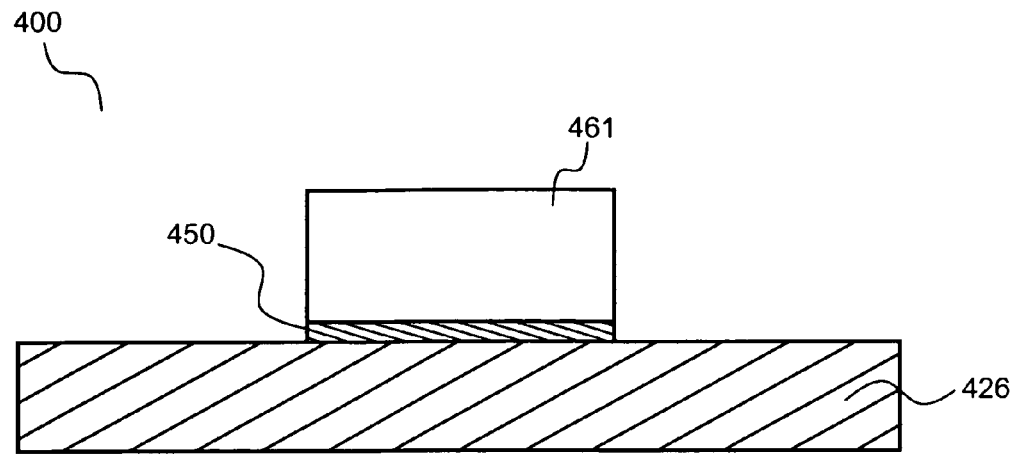
Figure 4J:
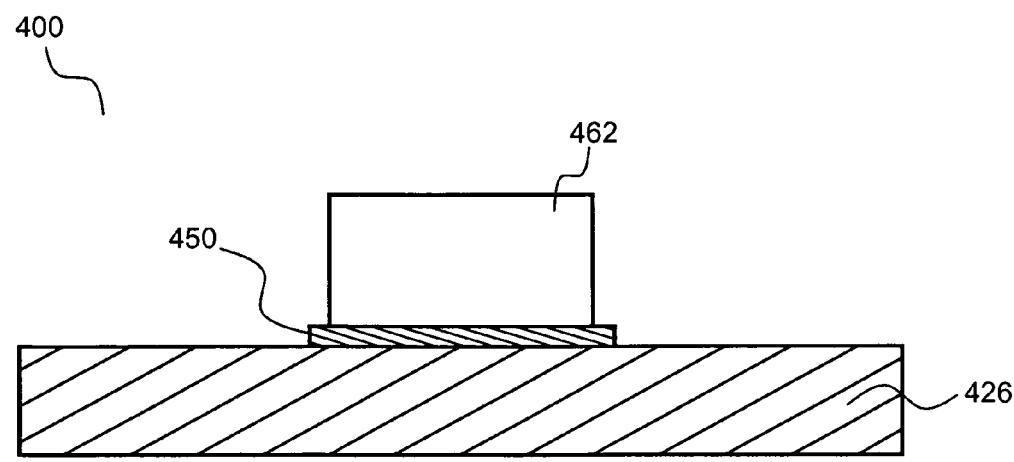

In one embodiment, the method described in FIGS. 4A-4J can be used to fabricate a semiconductor device such as the transistor 200 as illustrated in FIG. 2. In this case, the semiconductor layer 426 as shown in FIG. 4I is the semiconductor layer 226 in FIG. 2. Furthermore, dielectric layer 450 is the gate dielectric 250, and metal electrode 461 is the gate electrode 260. Similarly, source region 232, drain region 234, and metal contacts 268, 269 are formed on the semiconductor layer 226, as was described earlier in relation to FIG. 2 and applicable to the method described in FIGS. 4A-4J. The source region 232, drain region 234, and metal contacts 268, 269 can be formed either before or after the deposition of the hydrophobic layer 470. In another embodiment, the method described in FIGS. 4A-4J can be used to fabricate a capacitor. For example, the dielectric layer 450 in FIG. 4I or FIG. 4J can be formed as a capacitor dielectric to fabricate the capacitor.

Figure 5A:
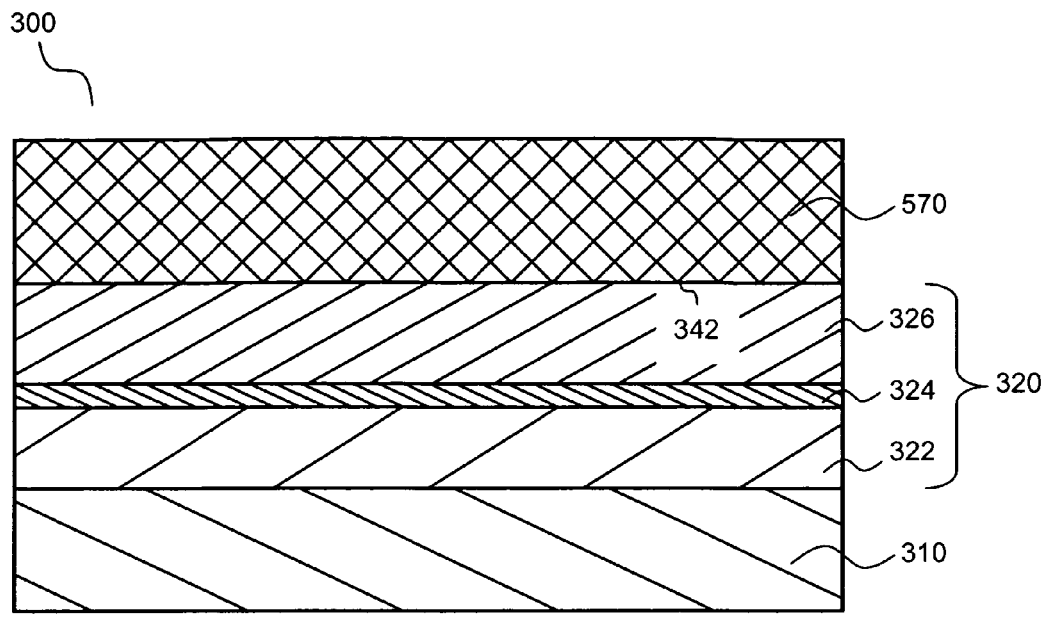
FIGS. 5A-5J illustrate a method of forming the III-V quantum well transistor of FIG. 3.

FIGS. 5A-5J illustrate a method of forming a semiconductor device, such as the III-V quantum well transistor 300 as shown in FIG. 3. As described in FIG. 3, the III-V quantum well transistor 300 comprises a semiconductor epitaxial structure 320 formed on a substrate 310, wherein the semiconductor epitaxial structure 320 includes a barrier layer 326, channel layer 324 and buffer layer 322. Barrier layer 326 comprises multiple semiconductor layers (e.g. spacer layer 327, Si δ-doped layer 328, top barrier 329) but is not shown in detail in FIGS. 5A-5J. Fabrication of the III-V quantum well transistor 300 begins by forming a hydrophobic mask having an opening on the barrier layer 326, wherein the opening exposes a portion on the barrier layer 326 where a dielectric layer is desired to be formed. In one embodiment, the fabrication of the hydrophobic mask begins by blanket depositing a masking layer 570 on a top surface 342 of the barrier layer 326 as shown in FIG. 5A.

Figure 5B:
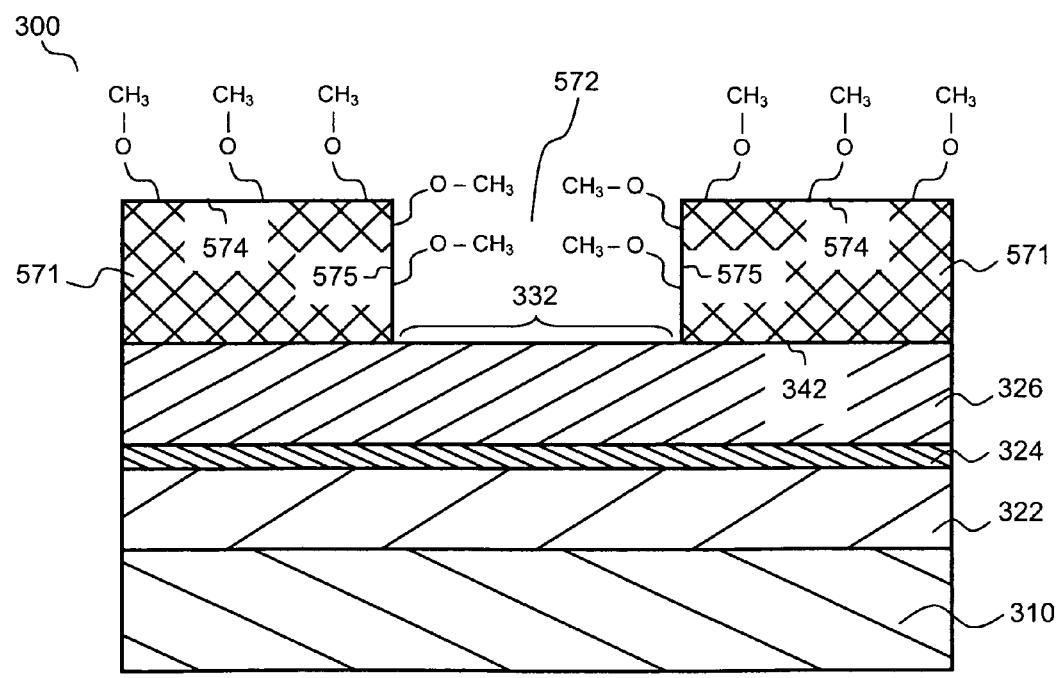

In one embodiment, the masking layer 570 as shown in FIG. 5A is a photo-resist layer that is made of a highly hydrophobic and photo-definable material. Photo-resist layer is made from a highly hydrophobic material so as to prevent dielectric nucleation thereon during the subsequent process of forming the dielectric layer. In a specific embodiment, photo-resist layer is made of a material that comprises methoxy (—O—CH$_3$) functional groups, such as but not limited to poly-methyl-methacrylate (PMMA). The photo-resist layer is blanket deposited on the top surface 342 of the barrier layer 326 using conventional methods such as a spin coating technique. Then, the photo-resist layer is exposed to a radiation source such as an ultra-violet (UV) light or an electron beam (e-beam) and subsequently developed to form an opening 572 and create a patterned photo-resist layer 571 as shown in FIG. 5B. In one embodiment, the photo-resist layer is exposed to a UV light having a wavelength in the range of 100-300 nm, depending on the type of material the photo-resist layer is made of.

In an embodiment, the portions of photo-resist layer to be exposed to the radiation source will be removed upon developing the photo-resist layer, i.e. photo-resist layer is composed of a positive photo-resist material. In a specific embodiment, photo-resist layer is composed of positive photo-resist material selected from the group consisting of the PMMA as described earlier, a 248 nm resist, a 193 nm resist, a 157 nm resist and an extreme ultra-violet (EUV) resist.

In another embodiment, the portions of photo-resist layer to be exposed to the light source will be retained upon developing the photo-resist layer, i.e. photo-resist layer is composed of a negative photo-resist material. In a specific embodiment, photo-resist layer is composed of a negative photo-resist material selected from the group consisting of poly-cis-isoprene and poly-vinyl-cinnamate.

The patterned photo-resist layer 571 remains highly hydrophobic and is hereinafter referred to as a hydrophobic mask 571. In one embodiment, hydrophobic mask 571 is PMMA that comprises methoxy (—O—$CH_3$) functional groups. Referring to FIG. 5B, the top surfaces 574 and side surfaces 575 of the hydrophobic mask 571 are terminated with methoxy (—O—$CH_3$) functional groups that prevents dielectric nucleation thereon during the latter process of forming the dielectric layer. Opening 572 extends from top surface 574 of the patterned photo-resist layer 571 to the top surface 342 of the barrier layer 326. In particular, the opening 572 exposes a portion 332 (hereinafter referred to as exposed portion 332) on the top surface 342 of the barrier layer 326, wherein the exposed portion 332 is a region where a dielectric layer is desired to be formed.

In another embodiment, the masking layer 570 is a photo-resist layer made from a material that is not sufficiently hydrophobic to prevent dielectric nucleation thereon during the subsequent process of forming the dielectric layer. For example, the masking layer 570 is a phenolic resin matrix with a diazonaphthoquinone sensitizer. After patterning the phenolic resin with well-known photolithography process, the patterned phenolic resin is exposed to a chemical solution to increase its hydrophobicity, thus forming the hydrophobic mask 571. For example, the patterned phenolic resin is exposed to a chemical solution, such as but not limited to organo alcohols, organo esters and organo ethers to increase its hydrophobicity.

In another embodiment, the masking layer 570 is made of a non-photodefinable material that is not sufficiently hydrophobic to prevent dielectric nucleation thereon during the subsequent process of forming the dielectric layer. For example, the masking layer 570 is an organo terminated layer such as but not limited to organo-siloxane, organic polymers and carbon-based oligimers. Masking layer 570 is patterned using well-known photolithography and etching techniques to form a patterned masking layer having opening 572. Then, the patterned masking layer is exposed to a chemical treatment to make its surfaces hydrophobic without making the exposed portion hydrophobic, thus forming the hydrophobic mask 571. In a specific embodiment, the chemical treatment uses a chemical solution selected from the group consisting of organo alcohols, organo esters and organo ethers.

Figure 5C:
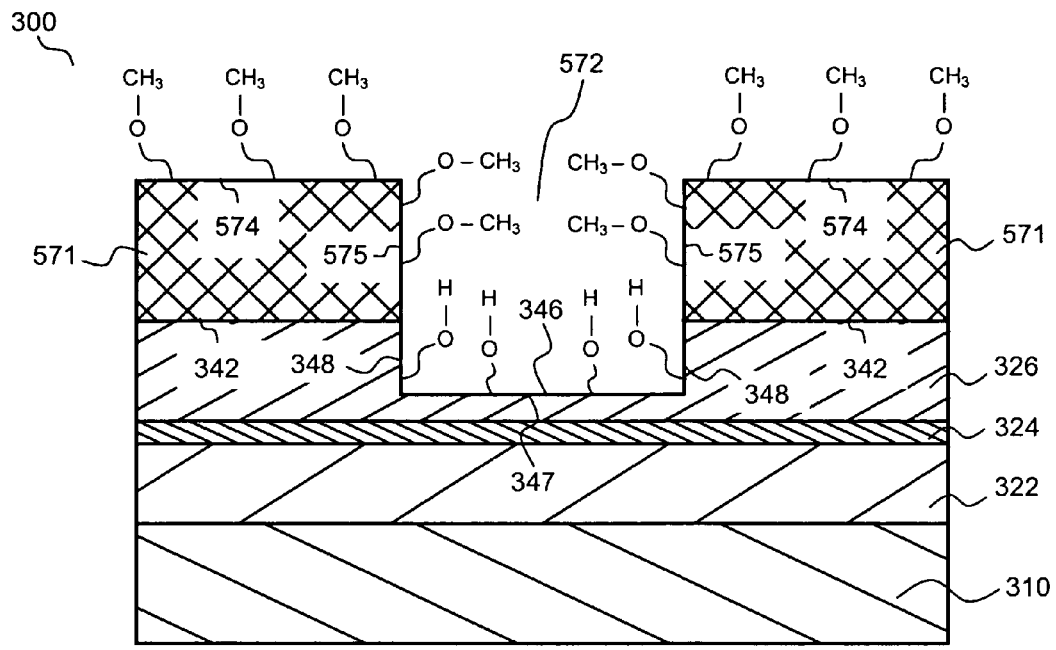

Next, as shown in FIG. 5C, a recess or trench 346 is formed in the exposed portion 332 of the barrier layer 326. The trench 346 includes a bottom surface 347 and sidewalls 348, wherein the sidewalls 348 extend from the bottom surface 347 of the trench 346 to the top surface 342 of the barrier layer 326. The sidewalls 348 are self-aligned to the opening 572 of the hydrophobic mask 571. Furthermore, the bottom surface 347 and sidewalls 348 of the trench 346 are formed as hydrophilic surfaces consisting of hydroxyl (—O—H) functional groups.

In one embodiment, the trench 346 is formed by exposing a chemical treatment to the hydrophobic mask 571 and the exposed portion 332 of the barrier layer 326, wherein the chemical treatment is reactive to the exposed portion 332 and unreactive to the hydrophobic mask 571. In an embodiment of the present invention, the chemical treatment employs an aqueous solution that is acid-based and comprises an acid, an oxidant, and a water diluent. For example, the acid used can be citric acid, lactic acid or nitric acid ($HNO_3$), and the oxidant can be hydrogen peroxide ($H_2O_2$). The aqueous solution chemically reacts with the exposed portion 332 to form the trench 346 thereon having bottom surface 347 and sidewalls 348. Simultaneously, the bottom surface 347 and sidewalls 348 are formed as hydrophilic surfaces by the same aqueous solution. The hydrophilic bottom surface 347 and sidewalls 348 are terminated with hydroxyl (—O—H) functional groups as shown in FIG. 5C. On the other hand, the hydrophobic mask 571 consisting of methoxy (—O—$CH_3$) functional groups is unreactive to the aqueous solution and the top and side surfaces 574, 575 of the hydrophobic mask 571 remain terminated with methoxy (—O—$CH_3$) functional groups. Furthermore, the trench 346 is formed to a predetermined depth, wherein the predetermined depth refers to the distance from the top surface 342 of the barrier layer 326 to the bottom surface 347 of the trench 346. The predetermined depth of the trench 346 as formed relative to the channel layer 328 determines if the III-V quantum well transistor 300 operates as an enhancement mode or depletion mode device.

In another embodiment, the trench 346 is first formed on the exposed portion 332 before the bottom surface 347 and sidewalls 348 of the trench 346 are made hydrophilic. In one embodiment, a dry-etch is performed on the III-V quantum well transistor 300 to form the trench 346 in the exposed portion 332 of the barrier layer 326. The trench 346 comprises bottom surface 347 and sidewalls 348. In a specific embodiment, the dry-etch utilizes an ion beam etching, such as but not limited to an argon (Ar) beam. Next, a chemical treatment is exposed to the bottom surface 347 and sidewalls 348 of the trench 346 and the hydrophobic mask 571. In one embodiment, the chemical solution employs an aqueous solution such as but not limited to ammonia hydroxide ($NH_4OH$). The ammonia hydroxide reacts with the bottom surface 347 and sidewalls 348 to form hydrophilic surfaces thereon such that the bottom surface 347 and sidewalls 348 are terminated with hydroxyl (—O—H) functional groups as shown in FIG. 5C. On the other hand, the hydrophobic mask 571 consisting of methoxy (—O—$CH_3$) functional groups is unreactive to ammonia hydroxide and the top and side surfaces 574, 575 of the hydrophobic mask 571 remain terminated with methoxy (—O—$CH_3$) functional groups.

Next, a gate dielectric layer is selectively formed on the trench 346 but not on the hydrophobic mask 571. In one embodiment, gate dielectric is formed by an atomic layer deposition (ALD) technique. In an ALD process, the III-V quantum well transistor 300 is alternatingly exposed to a first precursor and a second precursor to form the gate dielectric on the trench 346 but not on the hydrophobic mask 571. In one embodiment, to form a metal oxide dielectric, the first precursor is a metal-containing precursor and the second precursor is an oxygen-containing precursor. In a specific embodiment, the metal-containing precursor is a metal halide, such as but not limited to hafnium tetrachloride ($HfCl_4$), hafnium bromide ($HfBr_4$), hafnium iodide ($HfI_4$), zirconium tetrachloride ($ZrCl_4$) and lanthanum trichloride ($LaCl_3$), and the second oxygen-containing precursor is water ($H_2O$).

Figure 5D:
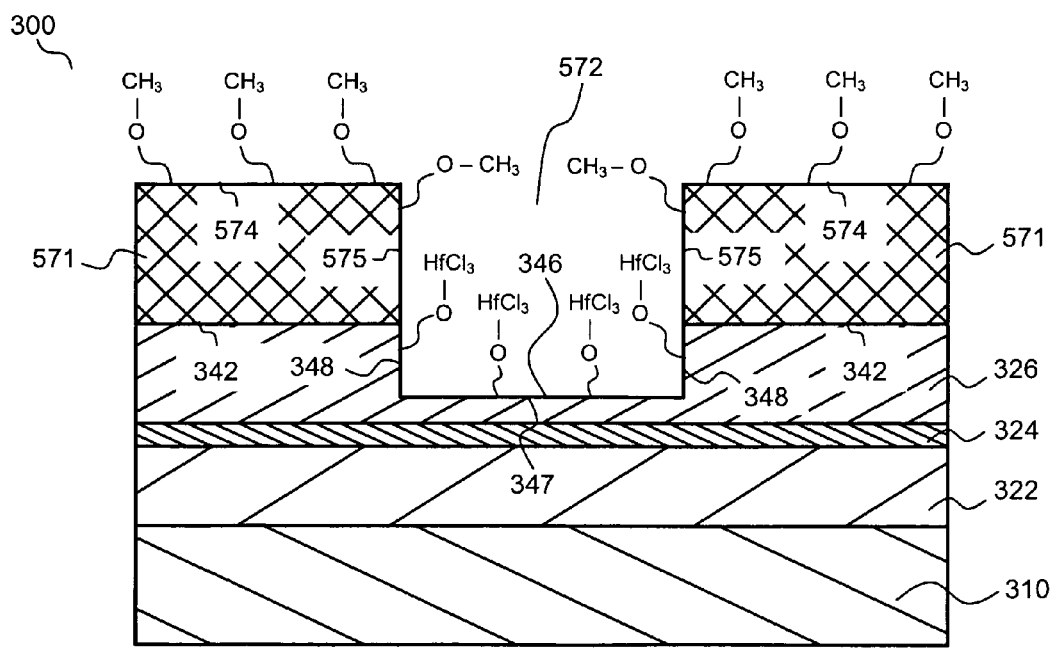
Figure 5E:
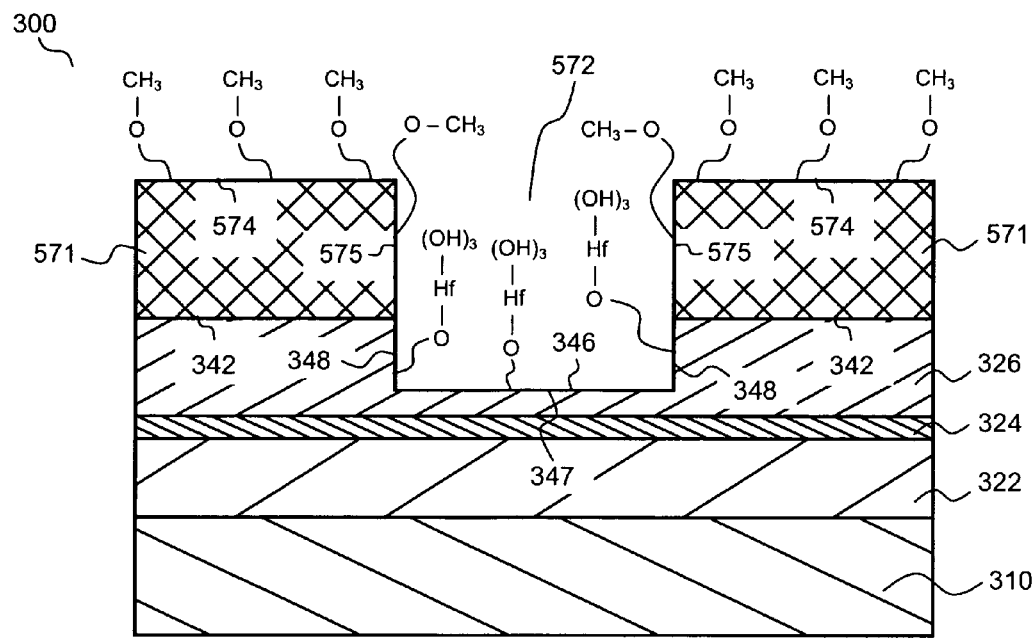

FIGS. 5D and 5E illustrate one ALD cycle of forming the gate dielectric. In FIG. 5D, the III-V quantum well transistor 300 is exposed to the first precursor. In one embodiment, the first precursor is a metal-containing precursor, for example $HfCl_4$, which reacts with the hydroxyl (—O—H) terminated hydrophilic bottom surface 347 and sidewalls 348 of the trench 346 to form a metal-centered ligand (e.g. —O—$HfCl_3$). After exposing to the first precursor, the III-V quantum well transistor 300 is exposed to the second precursor in FIG. 5E. The second precursor is an oxygen-containing precursor, for example water ($H_2O$), which converts the metal-centered ligand (—O—$HfCl_3$) to a metal-hydroxyl ligand (e.g. O—Hf—$(OH)_3$). This completes one ALD cycle. The ALD cycle is then repeated until a desired thickness of the gate dielectric is formed conformal to the bottom surface 347 and sidewalls 348 of the trench 346. For example, 20-30 ALD cycles may be performed to form a metal oxide dielectric with a thickness of 10-20 angstroms.

Figure 5F:
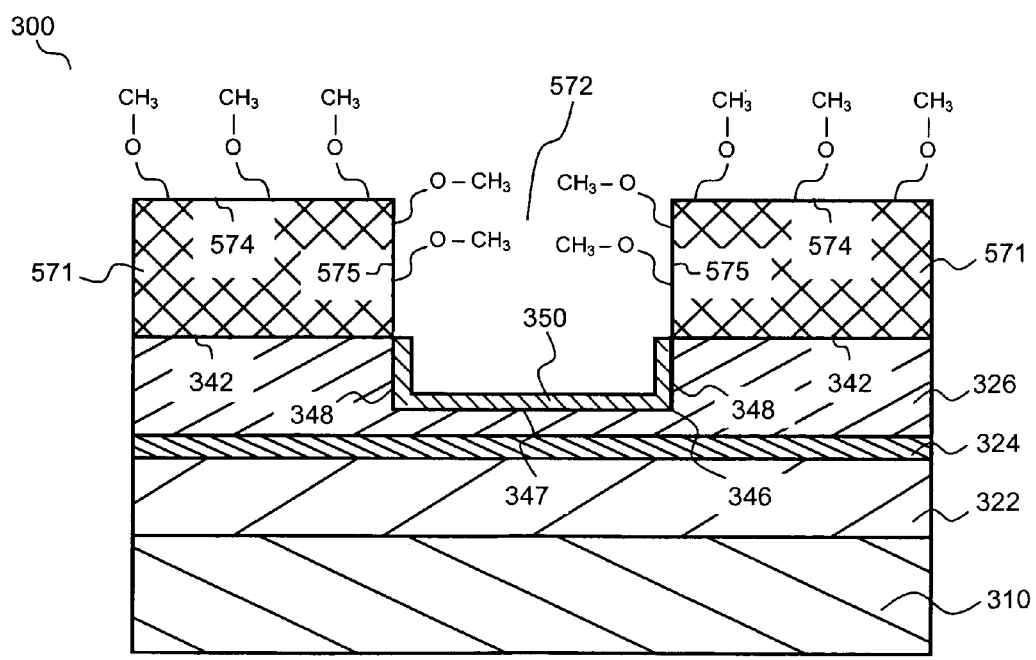

FIG. 5F illustrates the gate dielectric 350 formed conformally on the bottom surface 347 and sidewalls 348 of the trench 346 but not the hydrophobic mask 571. The hydrophobic mask 571 consisting of methoxy (—O—$CH_3$) functional groups is unreactive to both the first and second precursors, thus preventing the dielectric growth or nucleation on the hydrophobic mask 571. In the case where the first and second precursors use $HfCl_4$ and water ($H_2O$) respectively, the gate dielectric 350 formed is a hafnium oxide ($HfO_2$) dielectric, wherein the $HfO_2$ dielectric is a high-k dielectric. In another embodiment, the first and second precursors use $ZrCl_4$ and water ($H_2O$) respectively. Then, the gate dielectric 350 formed is a zirconium oxide ($ZrO_2$) dielectric, which is also a high-k dielectric. Hence, by manipulating the type of functional groups present on the hydrophobic mask 571 and the trench 346 on the barrier layer 326, the growth of the gate dielectric 350 can be specifically directed onto the trench 346. Furthermore, the deposition of the gate dielectric 350 on the barrier layer 326 is self-aligned to the opening 572 of the hydrophobic mask 571.

Figure 5G:
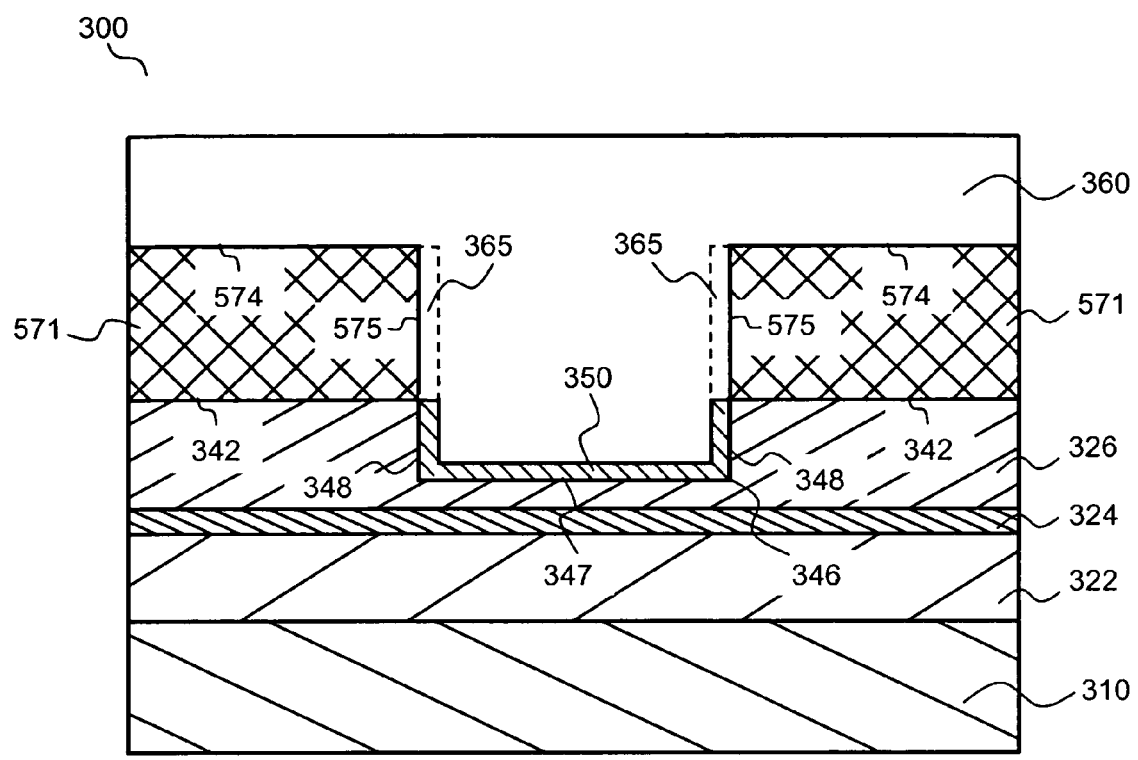
Figure 5H:
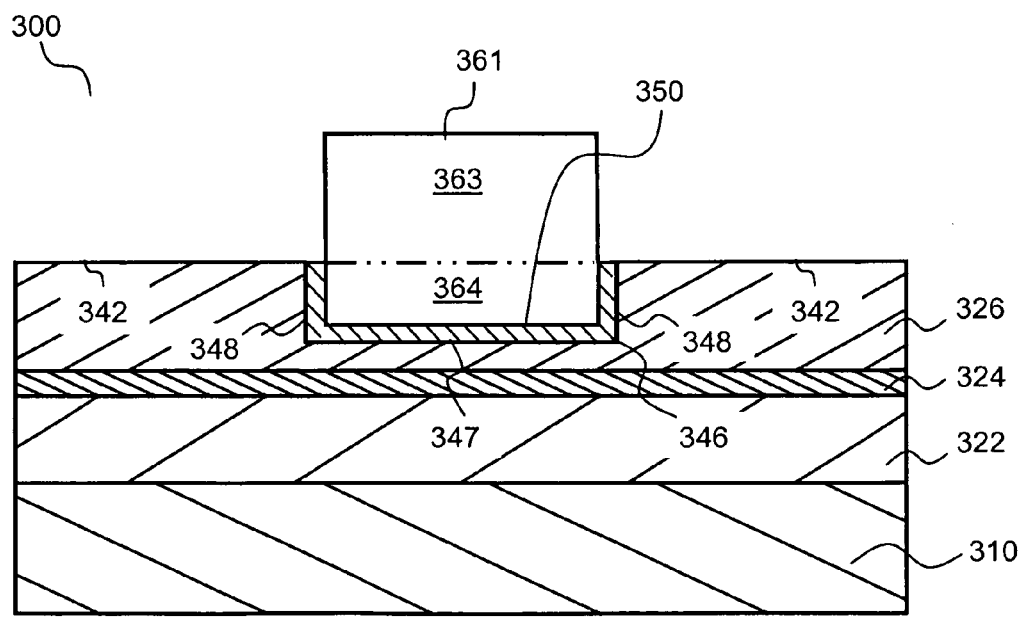

Next, a gate electrode is formed on top of the gate dielectric 350. In one embodiment, the fabrication of the gate electrode begins by depositing a metal layer 360 onto the gate dielectric 350 and the top and side surfaces 574, 575 of the hydrophobic mask 571, as shown in FIG. 5G. In one embodiment, the metal layer 360 is blanket deposited on the gate dielectric 350 and hydrophobic mask 571 by well known methods such as but not limited to chemical vapor deposition (CVD), physical vapor deposition (PVD) and evaporation. The metal layer 360 can be made of metal or metal alloy materials, such as but not limited to tungsten, tantalum, titanium and their nitrides. Furthermore, the metal layer 360 is selected with a work function that determines if the III-V quantum well transistor 300 operates as an enhancement mode or depletion mode device In one embodiment, a lift-off process is used to form the gate electrode 361, as shown in FIG. 5H. In the lift-off process, a removal solvent is exposed to the III-V quantum well transistor 300 in FIG. 5G to loosen the hydrophobic mask 571 formed on the barrier layer 326. Next, the hydrophobic mask 571 is lifted off or removed from the barrier layer 326, and any portions of the metal layer 360 formed on the hydrophobic mask 571 are also removed during the lift off. In particular, the lift off of the hydrophobic mask 571 causes the portions 365 of the metal layer 360 deposited on the side surfaces 575 of the hydrophobic mask 571 to be removed together with the hydrophobic mask 571. The only metal layer 360 remaining after the lift off is the portion of the metal layer 360 deposited directly onto the gate dielectric 350, as shown in FIG. 5H, which results in the formation of the metal electrode 361. This completes the lift-off process. In particular, the gate electrode 361 includes a top portion 363 and a bottom portion 364, wherein the bottom portion 364 is formed on the gate dielectric 350 and is encapsulated by the gate dielectric 350.

Figure 5I:
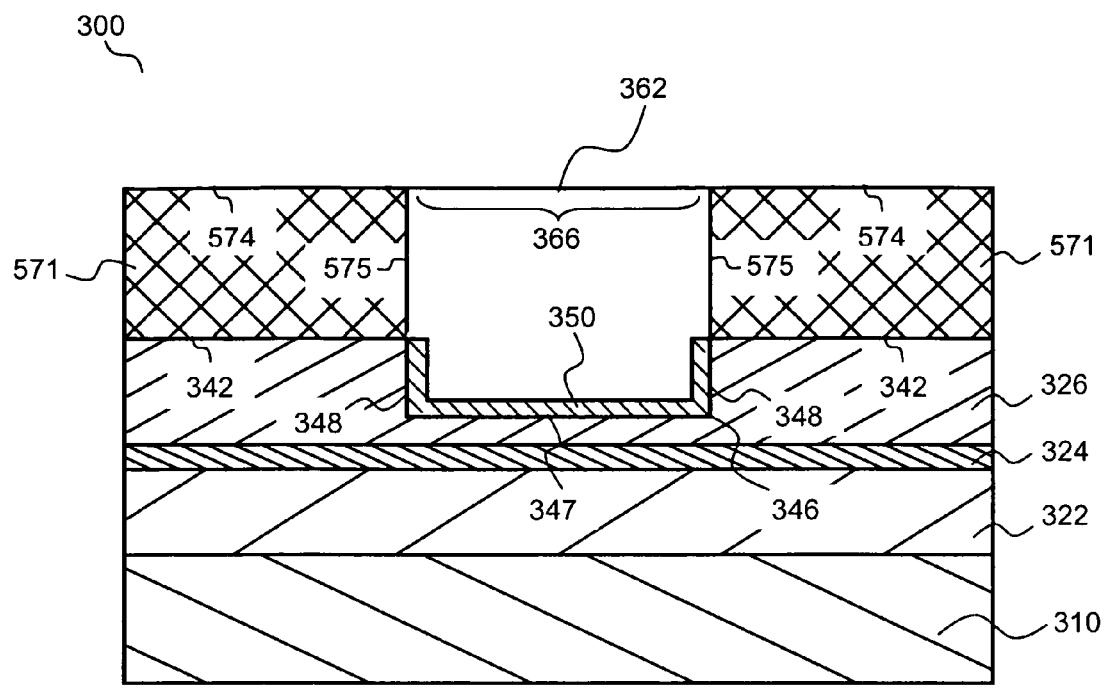
Figure 5J:
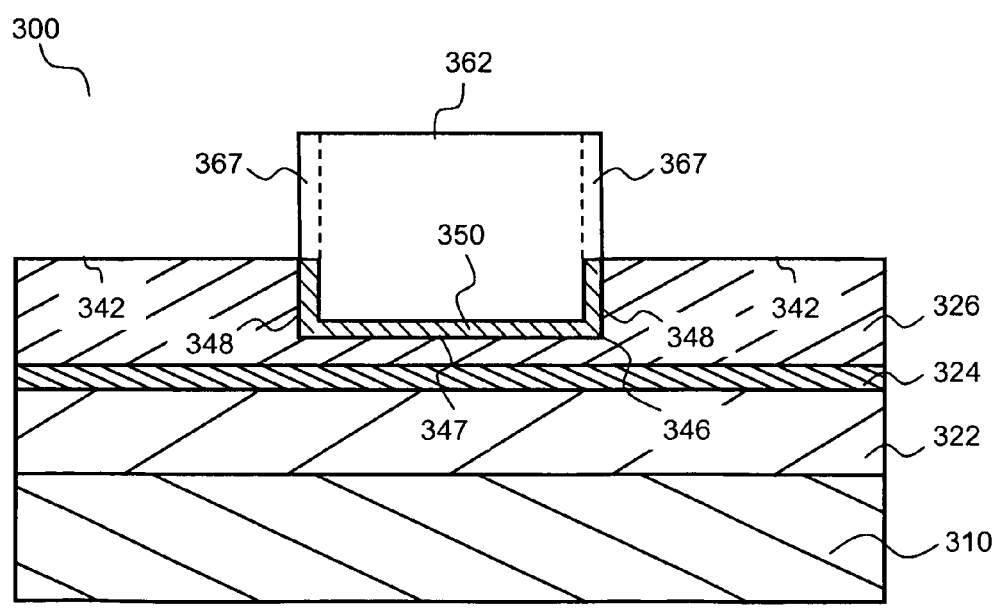

In another embodiment, the gate electrode 361 is formed by planarizing the metal layer 360 and then removing the hydrophobic mask 571. Beginning from FIG. 5G, the metal layer 360 is planarized using well known techniques such as chemical mechanical polishing (CMP) or plasma etch back to form a processed metal layer 362 as shown in FIG. 5I. The processed metal layer 362 has a top surface 366 that is coplanar with the top surface 574 of the hydrophobic mask 571. Next, the hydrophobic mask 571 is removed from the barrier layer 326 using known methods such as ashing or etching, leaving the processed metal layer 362 on the gate dielectric 350 as shown in FIG. 5J. Trimming of the processed metal layer 362 using well known photolithography and etching techniques is then performed to remove portions 367 of the processed metal layer 362 to form the gate electrode 361 as shown in FIG. 5H.

In another embodiment, the gate electrode 361 is formed by selectively deposition onto the gate dielectric 350. Beginning from FIG. 5F, a metal layer is deposited onto the gate dielectric 350 using well known methods such as but not limited to electrolysis deposition to form the metal layer 362 as shown in FIG. 5I. The hydrophobic mask 571 is then removed from the barrier layer 326 to reveal the metal layer 362 deposited on the gate dielectric 350. Trimming of the metal layer 362 is then performed using well known photolithography and etching techniques to remove portions 367 of the metal layer 362 to form the gate electrode 361 as shown in FIG. 5H.

Similarly, source and drain regions, and metal contacts 368, 369 are formed on the barrier layer 326, as was described earlier in relation to FIG. 3 and applicable to the method described in FIGS. 5A-5J. The source region and drain regions, and metal contacts 368, 369 can be formed either before or after the deposition of the masking layer 570.

As illustrated in FIGS. 4A-4J and 5A-5J, the methods of forming the transistors 200, 300 have several advantages. For example, both gate electrode and gate dielectric depositions are self-aligned because they are directed by the same hydrophobic mask. The area-selective approach of using ALD to form the gate dielectric does not require the need to use any etch process to pattern the gate dielectric, thus minimizing substrate damage or loss associated with etching. Furthermore, fabrication of a III-V quantum well transistor with a narrow channel length (Lg) is easily achievable since the ALD process forms a conformal gate dielectric and is not geometry sensitive. The combination of a high-k gate dielectric and a metal gate electrode provides a significant reduction in gate leakage current when compared to the Schottky metal gate stack.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A method of forming a semiconductor device comprising:
    forming a hydrophobic mask with an opening on a semiconductor film, wherein the opening defines an exposed portion on the semiconductor film;
    forming a hydrophilic surface on the exposed portion of the semiconductor film;
    selectively forming a high-k dielectric layer on the hydrophilic surface by atomic layer deposition, wherein the dielectric layer does not form on the hydrophobic mask; and
    depositing a metal layer on the dielectric layer.

2. The method of claim 1, wherein the atomic layer deposition comprises alternatingly exposing the hydrophilic surface to a first precursor and a second precursor to form the dielectric layer.

3. The method of claim 2, wherein the first precursor is a metal-containing precursor and the second precursor is an oxygen-containing precursor.

4. The method of claim 3, wherein the first precursor is hafnium tetrachloride and the dielectric layer formed is hafnium oxide.

5. The method of claim 3, wherein the first precursor is zirconium tetrachloride and the dielectric layer formed is zirconium oxide.

6. The method of claim 1, wherein forming the hydrophilic surface on the exposed portion of the semiconductor film comprises etching the exposed portion of the semiconductor film to form a recess in the exposed portion of the semiconductor film, wherein the recess comprises the hydrophilic surface.

7. The method of claim 1, wherein forming the hydrophobic mask with the opening on the semiconductor film comprises:
depositing a hydrophobic masking layer onto the semiconductor film;
exposing the hydrophobic masking layer to a radiation source; and
developing the hydrophobic masking layer to form the hydrophobic mask with the opening.

8. The method of claim 1, wherein the hydrophobic mask is selected from a group of materials that comprises functional groups methoxy groups (—O—$CH_3$), such as but not limited to polymethylmethacrylate.

9. The method of claim 1, wherein forming the hydrophilic surface on the exposed portion on the semiconductor film comprises exposing a chemical treatment to the exposed portion of the semiconductor film.

10. The method of claim 9, wherein the chemical treatment comprises an acid-based solution such as but not limited to citric acid, lactic acid and nitric acid, an oxidant such as but not limited to hydrogen peroxide ($H_2O_2$), and water diluent.

11. The method of claim 1, wherein the semiconductor film is selected from Group III-V compound semiconductor materials such as but not limited to AlP-based, AlAs-based, AlSb-based, GaP-based, GaAs-based, GaSb-based, GaAl-based, InP-based, InAs-based, InSb-based, InAl-based, and InGa-based semiconductor materials.

12. A method of forming a semiconductor device comprising:
providing a III-V semiconductor layer having a top surface;
forming a hydrophobic photo-resist on the top surface of the III-V semiconductor layer, the hydrophobic photo-resist having a top surface;
forming an opening in the hydrophobic photo-resist, wherein the opening extends from the top surface of the hydrophobic photo-resist to the top surface of the III-V semiconductor layer so as to expose a portion on the top surface of the III-V semiconductor layer;
etching a recess in the exposed portion of the III-V semiconductor layer, the recess having a hydrophilic surface;
forming a dielectric layer on the hydrophilic surface of the recess by atomic layer deposition; and
depositing a metal layer on the dielectric layer.

13. The method of claim 12, wherein the recess comprises a bottom wall and sidewalls, wherein the sidewalls extend from the top surface of the III-V semiconductor layer to the bottom wall of the recess.

14. The method of 13, wherein the sidewalls are self-aligned to the opening of the hydrophobic photo-resist.

15. The method of claim 12, wherein the atomic layer deposition comprises alternatingly exposing the hydrophilic surface to a first precursor and a second precursor to form the dielectric layer.

16. The method of claim 15, wherein the first precursor is a metal-containing precursor and the second precursor is a oxygen-containing precursor.

17. The method of claim 16, wherein the first precursor is hafnium tetrachloride and the dielectric layer formed is hafnium oxide.

18. The method of claim 16, wherein the first precursor is zirconium tetrachloride and the dielectric layer formed is zirconium oxide.

19. The method of claim 12, wherein the hydrophobic photo-resist is formed onto the top surface of the III-V semiconductor layer using a spin-coating technique.

20. The method of claim 12, wherein forming an opening in the hydrophobic photo-resist comprises:
exposing the hydrophobic photo-resist to a radiation source; and
developing the hydrophobic photo-resist to form the opening.

21. The method of claim 12, wherein the hydrophobic photo-resist is selected from the groups of materials that comprises functional groups methoxy groups (—O—$CH_3$), such as but not limited to polymethylmethacrylate.

22. The method of claim 12, wherein etching the exposed portion of the III-V semiconductor layer to form a hydrophilic surface on the exposed portion of the III-V semiconductor layer utilizes a chemical treatment that comprises an acid-based solution such as but not limited to citric acid, lactic acid and nitric acid, an oxidant such as but not limited to hydrogen peroxide ($H_2O_2$), and water diluent.

* * * * *